United States Patent
Kim (10) Patent No.: US 6,639,419 B2
(45) Date of Patent: Oct. 28, 2003

(54) SUPPLY VOLTAGE LEVEL DETECTOR

(75) Inventor: Dae Han Kim, Ichon-Shi (KR)

(73) Assignee: Hynix Semiconductor, Kyungki-Do (KR)

( * ) Notice: Subject to any disclaimer, the term of this patent is extended or adjusted under 35 U.S.C. 154(b) by 13 days.

(21) Appl. No.: 10/026,673

(22) Filed: Dec. 27, 2001

(65) Prior Publication Data

US 2003/0102855 A1 Jun. 5, 2003

(30) Foreign Application Priority Data

Nov. 30, 2001 (KR) .......................................... 2001-75438

(51) Int. Cl.[7] .......................... G01R 31/26; H03K 5/153
(52) U.S. Cl. ...................... 324/765; 324/158.1; 327/77; 327/81
(58) Field of Search ............................... 327/77, 80, 81, 327/87, 74, 206; 324/765, 158.1, 522; 323/312, 315

(56) References Cited

U.S. PATENT DOCUMENTS

| 6,041,012 A | * | 3/2000 | Banba et al. | ................. 365/226 |
| 6,147,521 A | | 11/2000 | Degoirat et al. | ............... 327/81 |
| 6,304,110 B1 | * | 10/2001 | Hirano | ........................ 327/108 |

FOREIGN PATENT DOCUMENTS

| EP | 1 045 251 A2 | 10/2000 |
| JP | 06174759 A | 6/1994 |

OTHER PUBLICATIONS

German Patent Office Search Report which is a counterpart of German Patent Application No. 10164359.4; Aug. 01, 2002; Germany.

* cited by examiner

*Primary Examiner*—N. Le
*Assistant Examiner*—Vincent Q. Nguyen
(74) *Attorney, Agent, or Firm*—Morgan, Lewis & Bockius LLP

(57) ABSTRACT

The present invention relates to a supply voltage level detector. The supply voltage level detector includes a reference voltage generator for generating the reference voltage of a constant level depending on a control signal, a compare voltage generator for generating a compare voltage the variation ratio of which is higher than the supply voltage supplied from the outside depending on the control signal, and a comparator for comparing the reference voltage and the compare voltage depending on the control signal to output a given signal. The present invention constructs the compare voltage generator in the supply voltage level detector so that the variation of the compare voltage depending on the variation of the supply voltage becomes great. Therefore, the present invention can improve the sensing margin of the comparator for sensing the difference between the reference voltage and the compare voltage. Also, the present invention can prevent erroneous operation by a noise to accomplish a stable operation.

10 Claims, 7 Drawing Sheets

SUPPLY VOLTAGE LEVEL DETECTOR

BACKGROUND OF THE INVENTION

1. Field of the Invention

The invention relates generally to a device for detecting the level of a supply voltage supplied from the outside, and more particularly to, a supply voltage level detector for detecting the difference in the reference voltage and a compare voltage to detect the voltage of a desired level.

2. Description of the Prior Art

Generally, semiconductor devices are comprised of various types of circuits. A supply voltage supplied from the outside drives each of the circuits. However, as erroneous operation of the circuit can be generated if the level of the supply voltage is changed to exceed the range of an operating voltage of each of the circuits, it is required that the circuit be normally operated within a voltage range of an adequate level by sensing the level of the supply voltage. For example, in case of a clamping circuit or a boosting circuit for applying a proper bias voltage to word lines in a memory device, it is required that a voltage within an adequate range be outputted by sensing variations in the supply voltage since the output voltage is varied depending on the supply voltage. In order to detect the level of the supply voltage, a supply voltage level detector is used.

Figure 1:
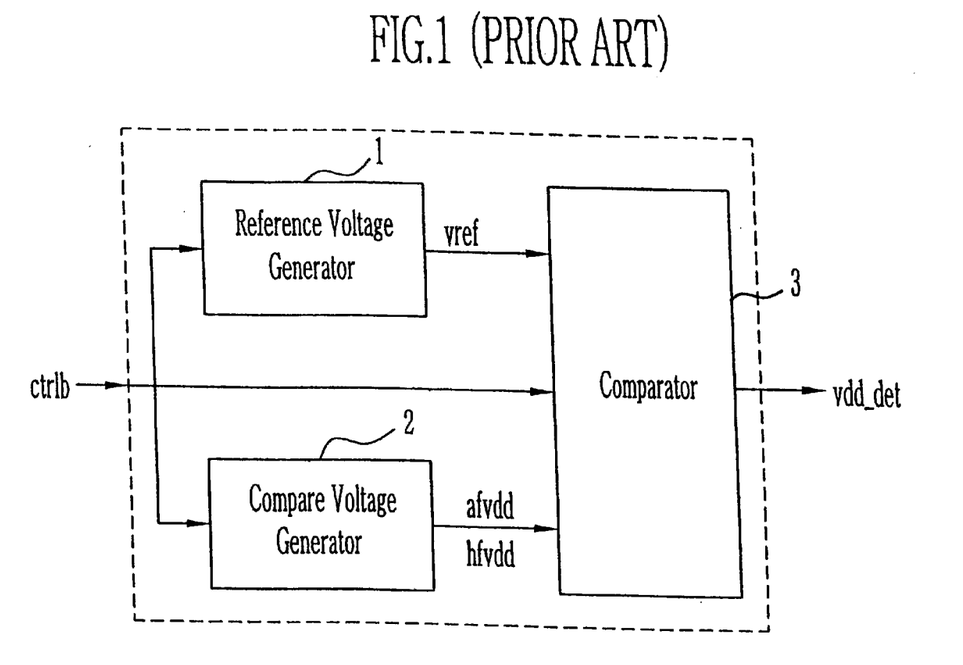
FIG. 1 is a block diagram of a supply voltage level detector.

As shown in FIG. 1, the supply voltage level detector includes a reference voltage generator 1 for generating a reference voltage Vref of a constant level depending on a control signal ctrlb, a compare voltage generator 2 for generating a compare voltage afvdd/hfvdd the variation ratio of which is greater than the supply voltage $V_{DD}$ supplied from the outside depending on a control signal ctrlb, and a comparator 3 for comparing the reference voltage Vref and the compare voltage afvdd/hfvdd depending on the control signal ctrlb to output a signal vdd_det of a HIGH state if the supply voltage $V_{DD}$ is higher than a given level and to output a signal vdd_det of a LOW state if the supply voltage $V_{DD}$ is lower than a given level.

Figure 6:
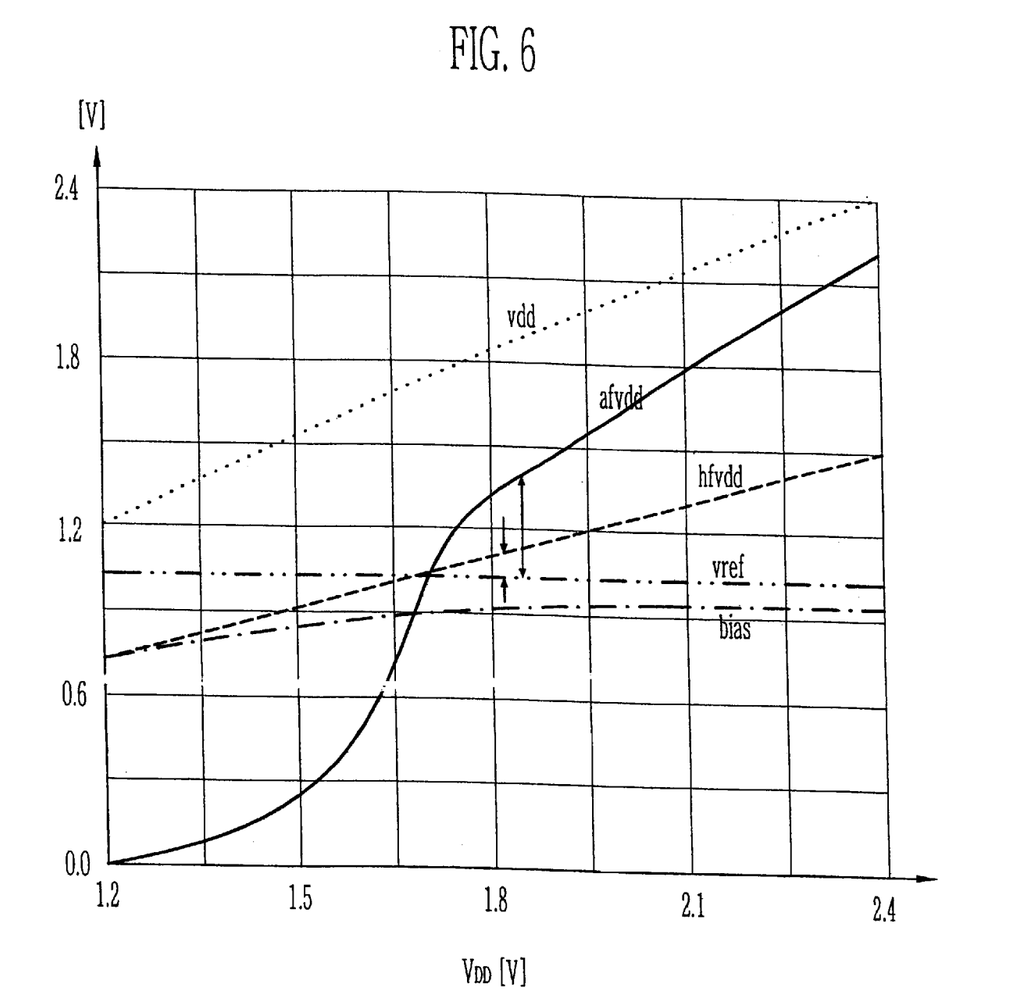
FIG. 6 shows a direct current (DC) voltage waveform of each of sections for explaining the operation of the compare voltage generator.

However, in the conventional supply voltage level detector, the variation in the voltage afvdd outputted from the compare voltage generator 2 is smaller than the variation in the supply voltage $V_{DD}$, as shown in FIG. 6. Therefore, there are problems that not only the detection speed is low but also the sensing margin is reduced by a noise.

Figure 2:
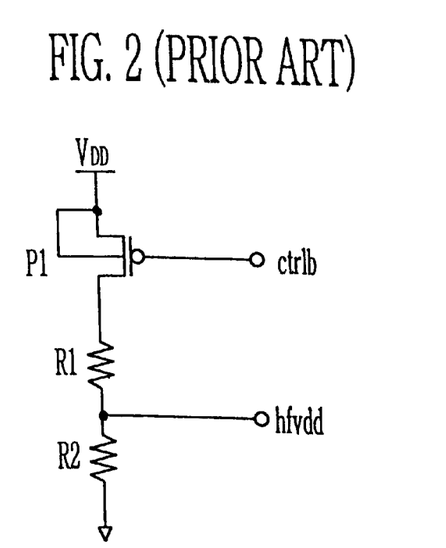
FIG. 2 is a circuit diagram for describing a conventional compare voltage generator.

In other words, the conventional compare voltage generator 2 is constructed to output the voltage hfvdd distributed by resistors R1 and R2 if a PMOS transistor P1 is turned on by the control signal ctrlb, as shown in FIG. 2, the difference in the reference voltage Vref and the compare voltage hfvdd is small as shown in FIG. 6, and the output of the comparator 3 is thus delayed so that an erroneous operation can be caused by a little noise.

SUMMARY OF THE INVENTION

The present invention is contrived to solve the above problems and an object of the present invention is to provide a supply voltage level detector in which a compare voltage generator is constructed so that the variations in a compare voltage becomes great depending on a supply voltage.

In order to accomplish the above object, a supply voltage level detector according to the present invention, is characterized in that it comprises a reference voltage generator for generating the reference voltage of a constant level depending on a control signal; a compare voltage generator for generating a compare voltage the variation ratio of which is higher than the supply voltage supplied from the outside depending on the control signal; and a comparator for comparing the reference voltage and the compare voltage depending on the control signal to output a given signal, wherein the compare voltage generator comprises, a first PMOS transistor driven by the control signal, a source of which being connected to the supply voltage; a resistor connected between a drain of the first PMOS transistor and a node; a second PMOS transistor connected between the supply voltage and an output terminal and driven by the control signal; and a NMOS transistor connected between the output terminal and the ground, a gate of which being connected to the node.

The NMOS transistor is formed in a substrate having a well of a triple structure, wherein a P well is connected to the node, an N well is connected to the supply voltage and the substrate is connected to the ground.

Also, a supply voltage level detector according to the present invention, is characterized in that it comprises a reference voltage generator for generating the reference voltage of a constant level depending on a control signal; a compare voltage generator for generating a compare voltage the variation ratio of which is higher than the supply voltage supplied from the outside depending on the control signal; and a comparator for comparing the reference voltage and the compare voltage depending on the control signal to output a given signal, wherein the compare voltage generator comprises, a first PMOS transistor driven by the control signal, a source of which being connected to the supply voltage; a resistor connected between a drain of the first PMOS transistor and a node; a diode connected between said node and a ground; a second PMOS transistor connected between the supply voltage and an output terminal and driven by the control signal; and a NMOS transistor connected between the output terminal and the ground, a gate of which being connected to the node.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

A supply voltage level detector according to the present invention includes a reference voltage generator 1 for generating a reference voltage Vref of a constant level depending on a control signal ctrlb, a compare voltage generator 2 for generating a compare voltage afvdd/hfvdd the variation ratio of which is greater than the supply voltage $V_{DD}$ supplied from the outside depending on a control signal ctrlb, and a comparator 3 for comparing the reference voltage Vref and the compare voltage afvdd/hfvdd depending on the control signal ctrlb to output a signal vdd_det of a HIGH state if the supply voltage $V_{DD}$ is higher than a given level and to output a signal vdd_det of a LOW state if the supply voltage $V_{DD}$ is lower than a given level, as shown in FIG. 1.

In particular, the compare voltage generator 2 is constructed so that the variation in the compare voltage afvdd depending on the variation in the supply voltage $V_{DD}$ becomes great compared to a conventional one. Therefore, the sensing margin of the comparator 3 for sensing the difference between the reference voltage Vref and the compare voltage afvdd can be improved.

For this, the present invention constructs the compare voltage generator 2 so that the variation in the compare voltage afvdd depending on the variation in the supply voltage $V_{DD}$ becomes greater, as follows.

FIG. 3A~FIG. 3D are circuit diagrams for describing a compare voltage generator according to the present invention.

Figure 3A:
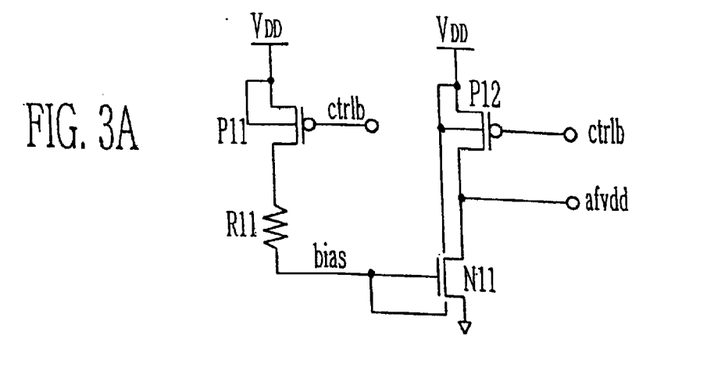
FIG. 3A~FIG. 3D are circuit diagrams for describing a compare voltage generator according to the present invention.

FIG. 3A is a basic circuit of the compare voltage generator according to the present invention.

A source of a PMOS transistor P11 driven by the control signal ctrlb is connected to the supply voltage $V_{DD}$ and a resistor R11 is connected between a drain of the PMOS transistor P11 and a node bias. Also, a PMOS transistor P12 driven by the control signal ctrlb is connected between the supply voltage $V_{DD}$ and the output terminal afvdd, and a NMOS transistor N11 a gate of which is connected to the node bias is connected between the output terminal afvdd and the ground.

Figure 4:
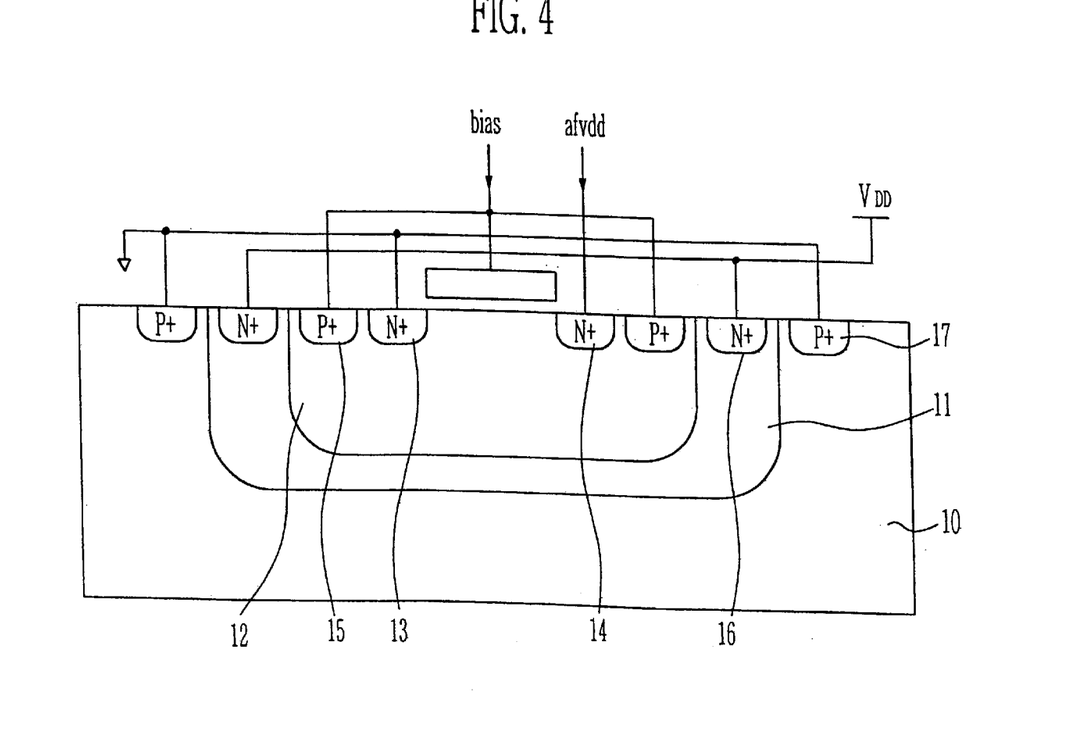
FIG. 4 is a cross-sectional view of a device for explaining a transistor having a well of a triple structure used in the present invention.

At this time, the NMOS transistor N11 is formed in the substrate 10 having a well of a triple structure, as shown in FIG. 4. A pickup region 15 of the P well 12 is connected to the node bias and a pick region 16 of the N well 11 is connected to the supply voltage $V_{DD}$. A pickup region 17 in the substrate 10 is connected to the ground along with the source 13.

Figure 3B:
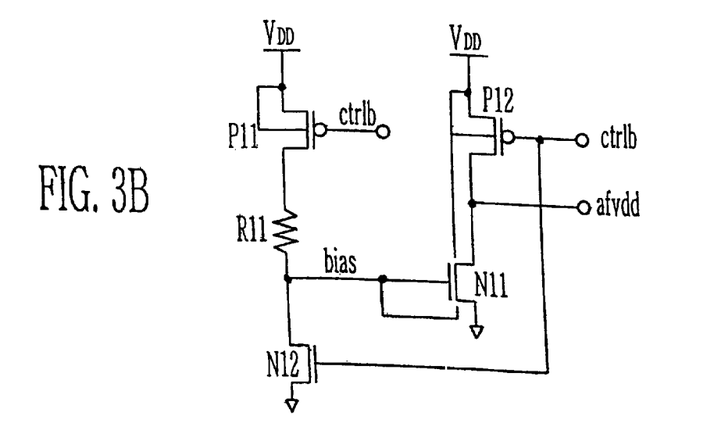
Figure 3C:
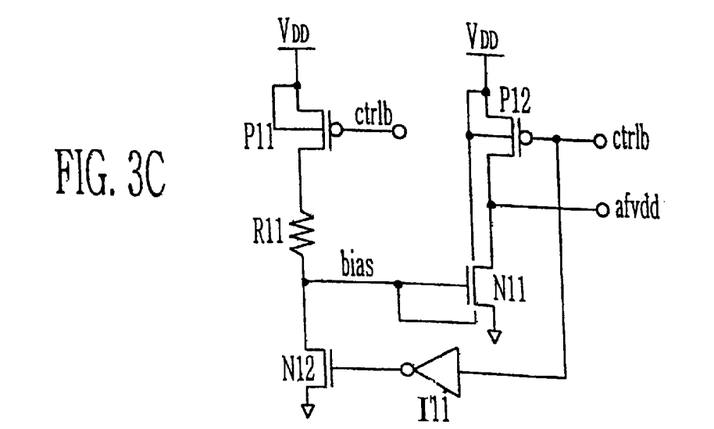
Figure 3D:
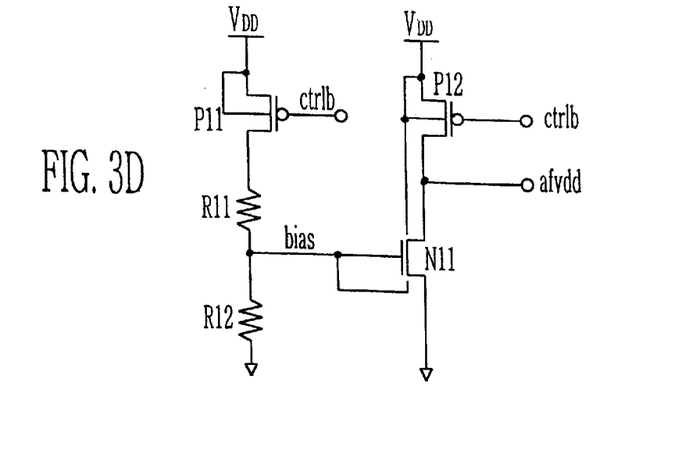

FIG. 3B illustrates a circuit in which a NMOS transistor N12 driven by the control signal ctrlb is connected between the node bias and the ground in the basic circuit such as FIG. 3A; FIG. 3C illustrates a circuit in which an inverter I11 for applying an inverted control signal ctrlb to the gate of the NMOS transistor N12, in the circuit of FIG. 3B; and FIG. 3D illustrates a circuit in which a resistor R12 is connected between the node bias and the ground in order to initialize the node bias in the basic circuit such as FIG. 3A.

An operation of the compare voltage generator 2 constructed as above will be below described.

In a standby state, the control signal ctrlb is kept to be a HIGH state to turn off the PMOS transistor P11 and the PMOS transistor P12 and the node bias is floated. Therefore, the gate of the NMOS transistor N11 and the P well 12 are kept floated so that unnecessary power consumption can be prevented.

When the control signal ctrlb is shifted to a LOW state and during a period where the supply voltage $V_{DD}$ is below 1.7V, the PMOS transistor P11, the PMOS transistor P12 and the NMOS transistor N12 are turned on. At this time, the potential of the node bias not saturated is applied to the gate of the NMOS transistor N11 and the pickup region 15 of the P well. Thus, the channel width of the NMOS transistor N11 is increased and a P-N junction between the pickup region 15 of the P well and the source 13 becomes a forward bias state while the potential of the node bias is increased, so that a DTMOS (Dynamic Threshold MOSfet) operation is induced to lower the threshold voltage (Vth) of the NMOS transistor N11. As a result, though the PMOS transistor P11 is turned on, the charge drivability of the NMOS transistor N11 is further increased to output the compare voltage afvdd that is lower than the conventional compare voltage hfvdd as in FIG. 6.

Meanwhile, in a period where the supply voltage $V_{DD}$ is over 1.7V, current flowing through the resistor R11 sufficiently flows into the P-N junction between the pickup region 15 of the P well and the source 13 being a forward bias state. Therefore, the potential of the node bias is not linearly increased depending on the supply voltage $V_{DD}$ but reaches a constant saturation state. Thus, as an effect by an increased of the gate voltage of the NMOS transistor N11 or the DTMOS operation is not further improved even the supply voltage $V_{DD}$ is increased, the charge drivability of the NMOS transistor N11 is not changed but the charge drivability of the PMOS transistor P12 is significantly increased depending on an increase of the supply voltage $V_{DD}$. As a result, the outputted compare voltage afvdd is rapidly increased, as shown in FIG. 6.

Figure 7:
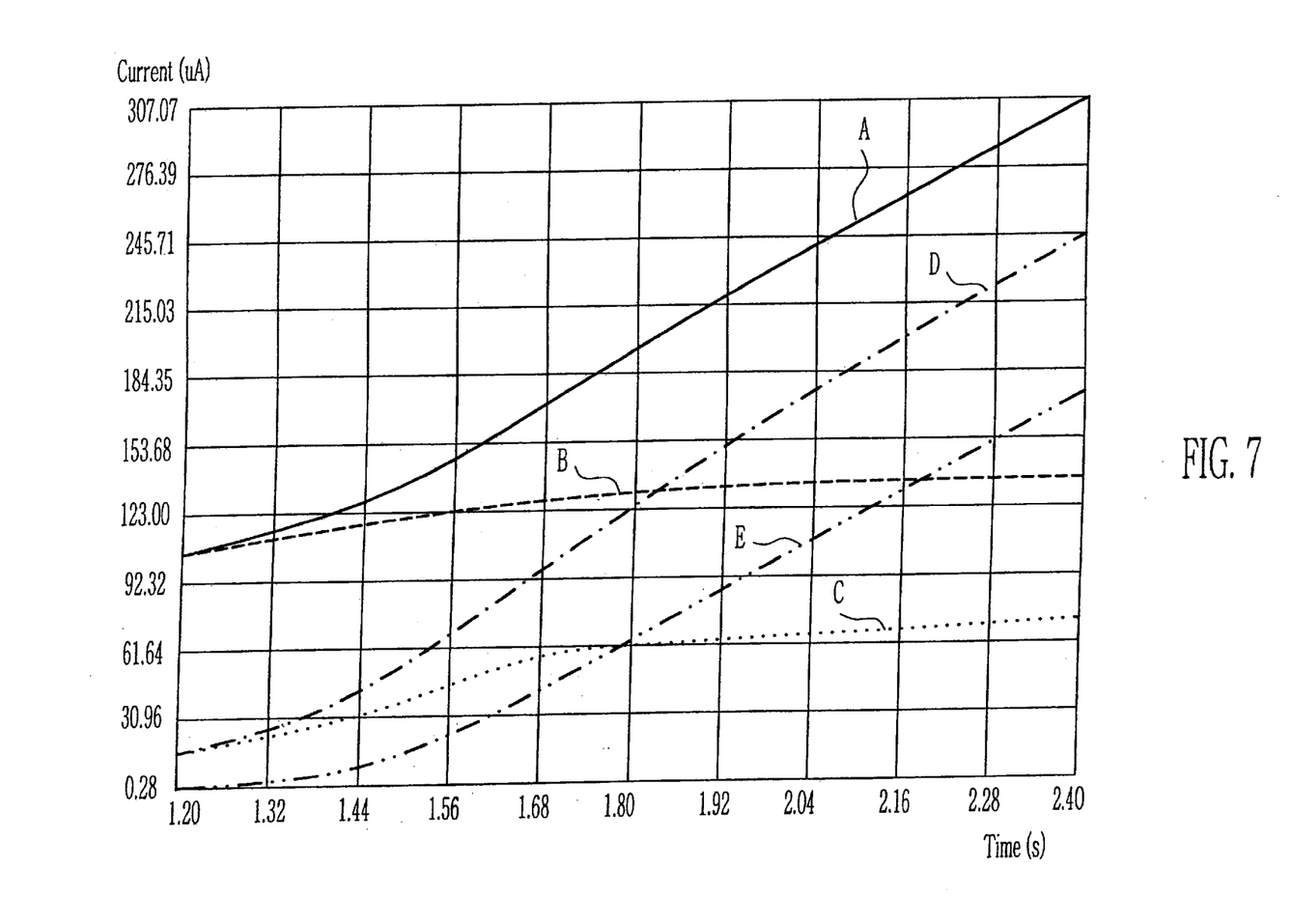
FIG. 7 shows a direct current (DC) voltage waveform of each of sections for explaining the operation of the compare voltage generator.

In FIG. 7, a waveform A represents current flowing into the resistor R11, a waveform B represents current flowing through the NMOS transistor N12, a waveform C represents current flowing through the PMOS transistor P12, a waveform D represents current flowing into the ground through the source 13 of the NMOS transistor N11, and a waveform E represent current flowing through the P-N junction between the P well 12 and the source 13 of the NMOS transistor N11.

FIG. 5A~FIG. 5D are circuit diagrams for explaining a compare voltage generator according to another embodiment of the present invention.

Figure 5A:
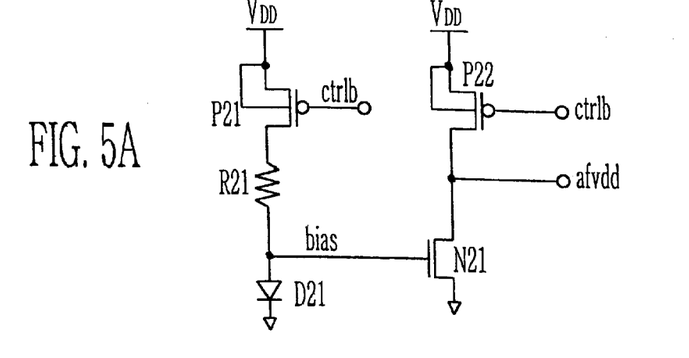
FIG. 5A~FIG. 5D are circuit diagrams for explaining a compare voltage generator according to another embodiment of the present invention.

FIG. 5A illustrates a basic circuit of the compare voltage generator according to another embodiment of the present invention.

A source of a PMOS transistor P21 driven by the control signal ctrlb is connected to the supply voltage $V_{DD}$ a resistor R21 is connected between a drain of a PMOS transistor P21 and the node bias. A diode D21 is connected between the node bias and the ground. Also, a PMOS transistor P22 driven by the control signal ctrlb is connected between the supply voltage $V_{DD}$ and the output terminal afvdd. A NMOS transistor N21 a gate of which is connected to the node bias is connected between the output terminal afvdd and the ground.

Figure 5B:
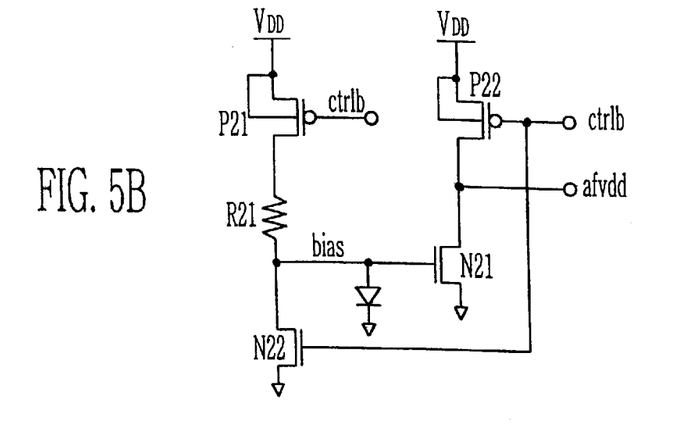
Figure 5C:
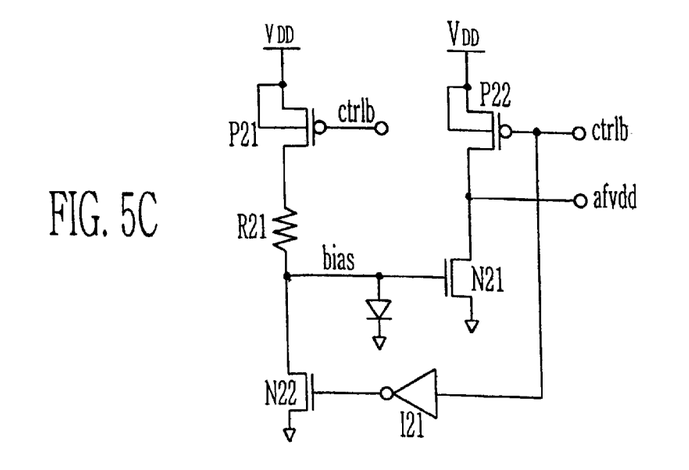
Figure 5D:
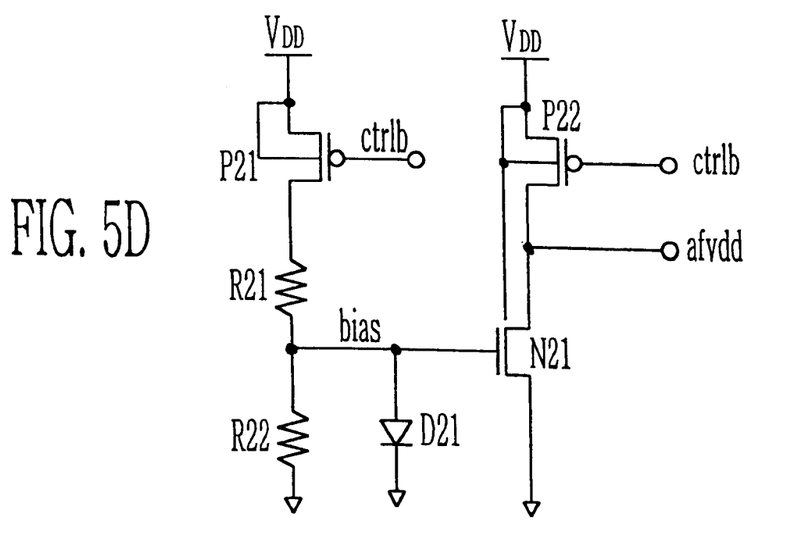

FIG. 5B illustrates a circuit in which a NMOS transistor N22 driven by the control signal ctrlb is connected between the node bias and the ground, as in the basic circuit such as FIG. 5A; FIG. 5C illustrates a circuit in which an inverter I21 for applying an inverted control signal ctrlb to the gate of the NMOS transistor N22 is further connected in the basic circuit of FIG. 5B; and FIG. 5D illustrates a circuit in which a resistor R22 is connected between the node bias and the ground in order to initialize the node bias, in the basic circuit such as FIG. 5A.

An operation of the compare voltage generator 2 constructed as above will be below described.

In a standby state, the control signal ctrlb is kept to be a HIGH state to turn off the PMOS transistor P21 and the PMOS transistor P22. As the node bias is floated, the gate of the NMOS transistor N21 is floated intact, so that unnecessary power consumption can be prevented.

When the control signal ctrlb is shifted to a LOW state and during a period where the supply voltage $V_{DD}$ is below 1.7V, the PMOS transistor P21, the PMOS transistor P22 and the NMOS transistor N22 are turned on. At this time, the potential of the node bias not saturated is applied to the gate of the NMOS transistor N21 and the diode D21. Therefore, the diode D21 becomes a forward bias state when the channel width of the NMOS transistor N21 is increased while the potential of the node bias is increased, so that the DTMOS operation is induced to lower the threshold voltage (Vth) of the NMOS transistor N21. As a result, though the PMOS transistor P21 is turned on, the charge drivability the NMOS transistor N21 is further increased so that the compare voltage afvdd lower than a conventional compare voltage hfvdd is outputted, as in FIG. 6.

Meanwhile, during a period where the supply voltage $V_{DD}$ is over 1.7V, as current flowing through the resistor R21 sufficiently flows through the diode D21 being a forward bias state, the potential of the node bias is not linearly increased depending on the supply voltage $V_{DD}$ but reaches a constant saturation state. Therefore, even when the supply voltage $V_{DD}$ is increased, as an effect by an increase of the gate voltage of the NMOS transistor N21 or the DTMOS operation is not further improved. Thus, the charge drivability of the NMOS transistor N21 is not varied but the charge drivability of the PMOS transistor P22 is significantly increased depending on an increase of the supply voltage $V_{DD}$, so that the compare voltage afvdd outputted is rapidly increased as shown in FIG. 6.

The present invention employs the NMOS transistor N11 forming in the substrate 10 having a well of a triple structure shown in FIG. 4 in order to increase the variation in the compare voltage afvdd depending on the variation in the supply voltage $V_{DD}$.

During a period where the supply voltage $V_{DD}$ is low, the channel of the PMOS transistor P12 is weakly formed to weaken the charge drivability. On the contrary, as the voltage distributed by the resistor R11 is supplied to the gate of the NMOS transistor N11, the P-N junction between the P well 15 and the source 13 becomes a forward bias state and the DTMOS operation is thus induced to lower the threshold voltage (Vth) of the NMOS transistor N11. In other words, the charge drivability of the NMOS transistor N11 is increased than the PMOS transistor P12 so that a low compare voltage afvdd can be outputted.

In addition, during a period where the supply voltage $V_{DD}$ is high, as the potential of the node bias is saturated, the charge drivability of the NMOS transistor N11 is limited but the charge drivability of the PMOS transistor P12 is increased to continuously increase the compare voltage afvdd outputted. At this time, as the P-N junction between the P well 15 and the source 13 of the NMOS transistor N11 becomes a forward bias state, the charge drivability of the NMOS transistor N11 is improved. Thus, discharge through the ground can be actively made so that the potential of the node bias is saturated.

As mentioned above, the present invention includes a compare voltage generator in a supply voltage level detector so that the variation in the compare voltage afvdd depending on the variation in the supply voltage $V_{DD}$ becomes great. Therefore, the present invention has advantages that it can improve the sensing margin of a comparator for sensing the difference between the reference voltage Vref and the compare voltage afvdd. The present invention can also prevent erroneous operation by a noise to accomplish a stable operation.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A supply voltage level detector, comprising:
    a reference voltage generator for generating a reference voltage of a constant level depending on a control signal;
    a compare voltage generator for generating a compare voltage which is higher than a supply voltage supplied from the outside depending on the control signal; and
    a comparator for comparing the reference voltage and the compare voltage depending on the control signal to output a given signal,
    wherein the compare voltage generator comprises,
        a first PMOS transistor driven by the control signal having a source connected to the supply voltage;
        a first resistor connected between a drain of the first PMOS transistor and a node;
        a second PMOS transistor connected between the supply voltage and an output terminal and driven by the control signal; and
        a first NMOS transistor connected between the output terminal and the ground, a gate of which being connected to the node, wherein a charge drivability of the NMOS transistor is changed by a potential of the gate.

2. The supply voltage level detector as claimed in claim 1, wherein the first NMOS transistor has a triple structure having a substrate, an N well and P well, wherein the P well is connected to the node, the N well is connected to the supply voltage, and the substrate is connected to the ground.

3. The supply voltage level detector as claimed in claim 1, further comprising a second NMOS transistor connected to the node and the ground and driven by the control signal.

4. The supply voltage level detector as claimed in claim 3, further comprising:
    an inverter connected between the control signal and the gate of the second NMOS transistor for supplying an inverted control signal to the gate of the second NMOS transistor.

5. The supply voltage level detector as claimed in claim 1, further comprising a second resistor connected between the node and the ground in order to initialize the node.

6. A supply voltage level detector, comprising:
    a reference voltage generator for generating a reference voltage of a constant level depending on a control signal;
    a compare voltage generator for generating a compare voltage which is higher than the supply voltage supplied from an outside depending on the control signal; and
    a comparator for comparing the reference voltage and the compare voltage depending on the control signal to output a given signal, wherein said compare voltage generator comprises,
a first PMOS transistor driven by the control signal having a source connected to the supply voltage;
a first resistor connected between a drain of the first PMOS transistor and a node;
a diode connected between the node and a ground;
a second PMOS transistor connected between the supply voltage and an output terminal and driven by the control signal; and
a first NMOS transistor connected between the output terminal and the ground, a gate of which being connected to the node, wherein a charge drivability of the NMOS transistor is changed by a potential of the gate.

7. The supply voltage level detector as claimed in claim 6, further comprising a second NMOS transistor connected to the node and the ground and driven by the control signal.

8. The supply voltage level detector according to claim 7, further comprising:
an inverter connected between the control signal and the gate of the second NMOS transistor for supplying an inverted control signal to the gate of the second NMOS transistor.

9. The supply voltage level detector as claimed in claim 6, further comprising a second resister connected between the node and the ground in order to initialize the node.

10. The supply voltage level detector as claimed in claim 6, wherein the first NMOS transistor has a triple structure having a substrate, an N well and a P well, wherein the P well is connected to the node, the N well is connected to the supply voltage, and the substrate is connected to the ground.

* * * * *